United States Patent [19]

Hicks et al.

[11] Patent Number: 4,981,019
[45] Date of Patent: Jan. 1, 1991

[54] SOLAR POWERED PORTABLE FOOD CONTAINER

[76] Inventors: Carole L. Hicks; Jeffrey S. Cudd, both of P.O. Box 115, Lake Lure, N.C. 28746

[21] Appl. No.: 436,781
[22] Filed: Nov. 14, 1989
[51] Int. Cl.⁵ .............................................. F25B 21/02
[52] U.S. Cl. ..................................... 62/3.62; 62/235.1; 62/457.7; 62/457.9
[58] Field of Search ................ 62/457.9, 457.7, 235.1, 62/3.62

[56] References Cited

U.S. PATENT DOCUMENTS

| | | | |
|---|---|---|---|
| 3,959,982 | 6/1976 | Denis | 62/223 |
| 4,311,017 | 1/1982 | Reed | 62/3 |
| 4,531,384 | 7/1985 | Paeye | 62/477 |
| 4,586,345 | 5/1986 | Friberg | 62/235.1 |
| 4,658,599 | 4/1987 | Kajiwara | 62/239 |
| 4,697,433 | 10/1987 | Paeye | 62/235.1 |
| 4,823,554 | 4/1989 | Trachtenberg et al. | 62/457.9 X |

Primary Examiner—Lloyd L. King
Attorney, Agent, or Firm—T. M. Gernstein

[57] ABSTRACT

A portable food container is cooled by a solar powered refrigeration unit and includes a thermoelectric power unit and heat pipes so that the container will be cooled even when there is no solar radiation and will have an even temperature distribution.

4 Claims, 3 Drawing Sheets

SOLAR POWERED PORTABLE FOOD CONTAINER

TECHNICAL FIELD OF THE INVENTION

The present invention relates to the general art of containers, and to the particular field of food containers.

BACKGROUND OF THE INVENTION

Many people are finding it desirable to carry food with them as they travel. This situation has long existed in connection with picnics, lunches and the like, and has engendered a plethora of designs for picnic baskets, lunch boxes and the like. However, as more and more people travel, there is a need for food containers that can be used on trips and while traveling. The just-mentioned picnic baskets and lunch boxes while satisfactory for some uses, have drawbacks which inhibit their use in conjunction with travel, expecially long transit times.

Principal among such drawbacks is the limited ability of such food containers to keep food cold during long trips. While such containers are generally insulated and can include places for ice packs or the like, such measures are of limited effectiveness, expecially if the food must be stored for several days or even weeks.

Therefore, the art has included designs for portable refrigeration units. While such units are more effective than the above-described picnic baskets or lunch boxes, these units also have several drawbacks. For example, these units often are of limited effectiveness under certain conditions. Another problem is the possibility of having a rather severe thermal gradient established within the container whereby one section of the container is quite cold while another section is considerably warmer. Proper food storage requires, not only cold conditions, but uniform temperature in the container.

Accordingly, there is a need for a food storage container which can maintain a proper environment for storing food for great lengths of time, and under varied conditions, and which provides a uniform temperature for the environment within the container.

OBJECTS OF THE INVENTION

It is a main object of the present invention to provide a food storage container which can maintain a proper environment for storing food for great lengths of time.

It is another object of the present invention to provide a food storage container which can maintain a proper environment for storing food for great lengths of time, and under varied conditions.

It is another object of the present invention to provide a food storage container which can maintain a proper environment for storing food for great lengths of time, and under varied conditions and which provides a uniform temperature for the environment within the container.

SUMMARY OF THE INVENTION

These, and other, objects are achieved by a food storage container which includes a refrigeration unit that is controlled by solar energy and which utilizes solar energy to power such refrigeration unit and which also contains heat pipes which distribute heat in the food storage container to establish a uniform temperature within that container. The refrigeration unit includes a pump for assisting circulation of fluid in the event the solar energy unit is not functioning at full speed, and that pump is connected to a thermoelectric power generation unit. The power generation unit utilizes the solar energy unit to charge a storage battery which operates the refrigeration unit when solar energy is not readily available, such as at night or if the container is stored in a dark enclosure for great lengths of time, such as on a train trip, or the like. The container also includes a fan and a thermostat for further ensuring a uniform temperature in the container.

In this manner, the food storage container of the present invention can be kept uniformly cold for great lengths of time and under varied conditions, including storage in a hot, dark place, such as a baggage car or baggage compartment or the like.

BRIEF DESCRIPTION OF THE DRAWING FIGURES

DETAILED DESCRIPTION OF THE PREFERRED EMBODIMENT OF THE INVENTION

Figure 1:
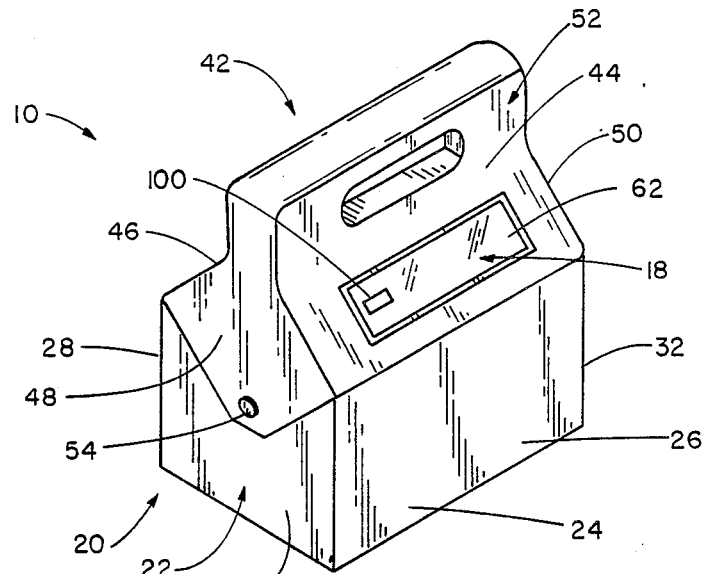
FIG. 1 is a perspective of a food storage container embodying the present invention.
Figure 2:
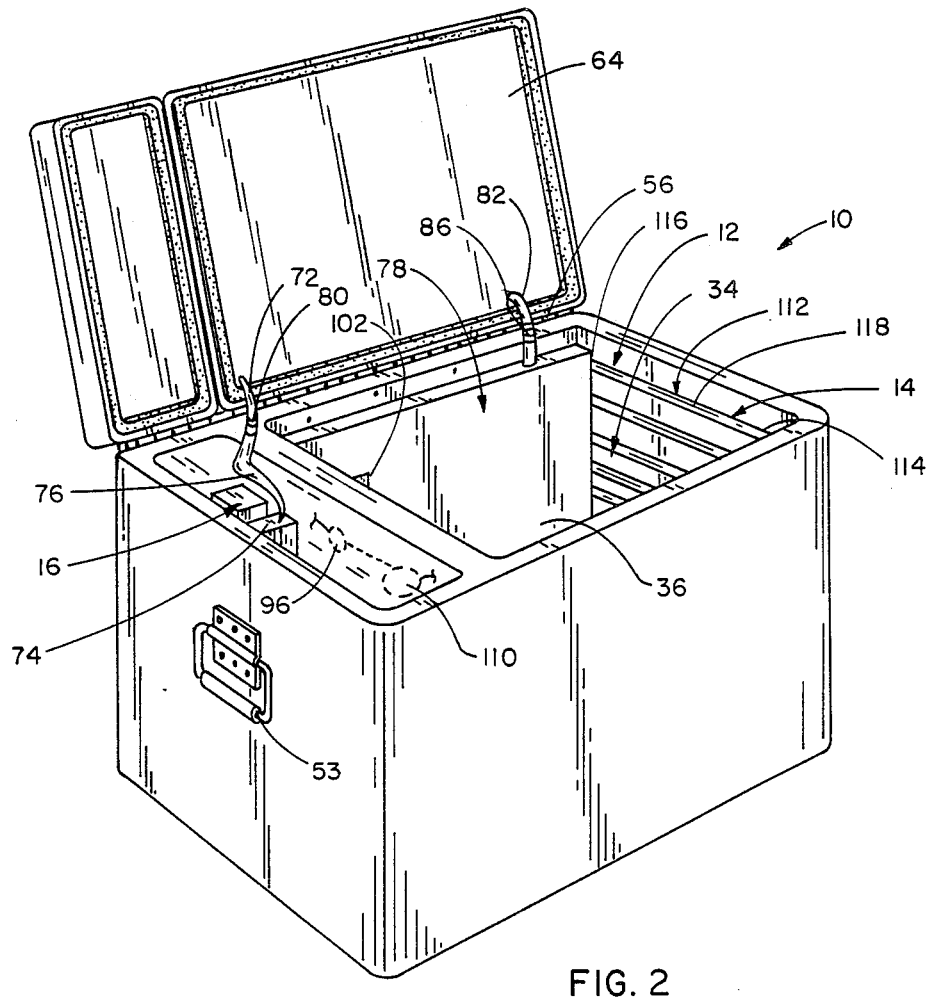
FIG. 2 is a perspective of a food storage container embodying the present invention in the open condition so the interior of the container is visible.

Shown in FIGS. 1 and 2 is a food storage container 10 embodying the present invention. The container 10 includes a cooling or refrigeration unit 12 that is solar powered and a heat distribution unit 14 that ensures an even temperature within the container. A power unit 16 is coupled to a solar energy collector 18 and powers the refrigeration unit when solar energy is not readily available. The container 10 is thus amenable for storing food at a low temperature for long periods of time.

The container 10 includes a case unit 20 which includes an open-topped food-containing portion 22 which is formed by a bottom outside wall 24 having a front outside wall 26, a rear outside wall 28 and end outside walls 30 and 32 extending upwardly therefrom to define a receptacle 34 having an open top 36 through which access to food stored in the container may be had. An interior wall 38 is connected to the front and rear outside walls and to the bottom wall and is spaced from the end wall 30 to define a compartment 40 within the case unit and adjacent to the receptacle 34.

The container also includes a top portion 42 that has side walls 44 and 46, end walls 48 and 50 and a handle 52 attached to the end walls. A carrying handle 53 can also be attached to the case unit as shown in FIG. 2. The unit can include a release button that is accessible by a thumb while gripping the handle 52. The handles can also include padding if desired. A pivot means, such as pivot pin 54 in FIG. 1 or piano hinge 56 in FIG. 2 connects the top portion to the food-containing portion. This pivot means permits that top to move between the FIG. 1 closed configuration in which the top covers the open top of the food-containing portion to the open configuration shown in FIG. 2 in which the food-containing portion is uncovered for access thereto.

Figure 3:
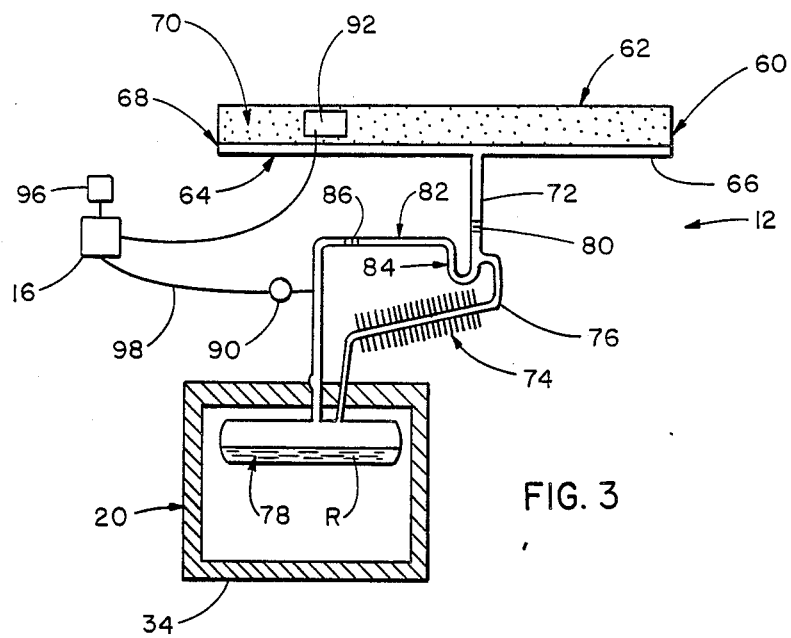
FIG. 3 is a schematic illustration of a solar powered refrigeration system.

The cooling unit 12 of the container is solar powered, but can also be powered by a storage battery as a backup power source in the event solar energy is not readily available. The cooling unit 12 is shown in FIG. 3, and includes a solar energy collector 60 which includes an upper surface 62 which is exposed to solar radiation, and a bottom surface 64. A space 66 is provided within the collector and a supporting layer 68 ensures that material 70 is held in place against the upper surface 62.

A conduit 72 fluidically connects the bottom surface 64 to an evaporator 74 via a duct 76 which is fluidically connected to a condenser 78 located inside the receptacle 34 on the rear wall thereof. It is noted that the conduit 72 has an accordion folded section 80 defined therein to allow the top to open and close. The condenser 78 is fluidically connected to the conduit 72 by a duct 82 and a trap 84. The duct 82 also has a foldable section 86 defined therein. Refrigerant R, such as freon or the like can be used in the system.

A full dicsussion of the operation of the cooling unit shown in FIGS. 2 and 3 is contained in U.S. Pat. No. 4,697,433, and the disclosure of that patent is incorporated herein by reference. As above mentioned, the container 10 is adapted to operated in the absence of solar energy, and thus the cooling unit includes a pump 90 fluidically connected to the duct 82 to force fluid through the system, and a electric heater unit 92 connected to the solar material 70 to heat such material in the absence of solar radiation and thus operate the cooling circuit. The pump and the heater are powered by the power source unit 16 that is controlled by a thermostat 96 located in the receptacle 34 and senses when the temperature in that receptacle is lower than a preset value and turns on the power source 16 and the pump 90. Line conductors, such as conductor 98, electrically connect the just-mentioned elements together.

Figure 4:
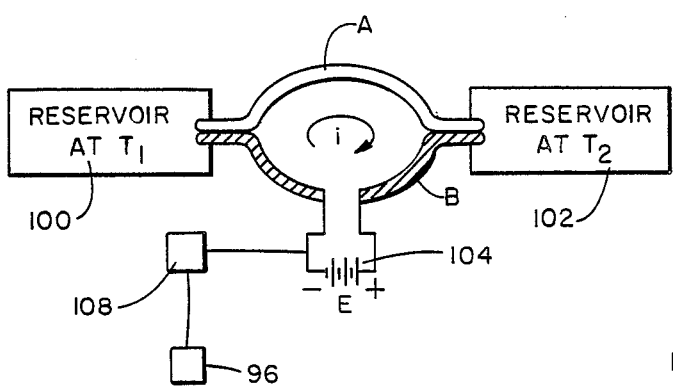
FIG. 4 is a schematic illustration of a basic thermoelectric device which is used in the present invention.
Figure 5:
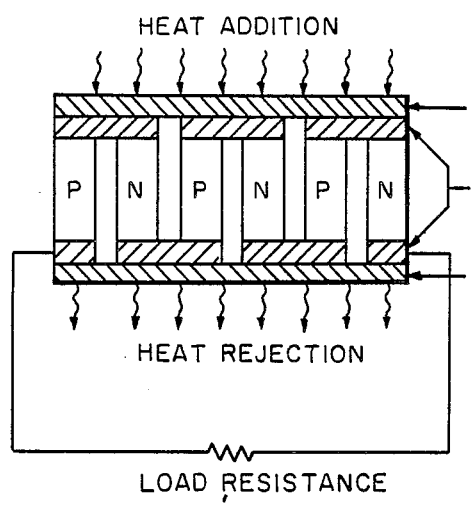
FIG. 5 is a schematic illustration of a series singlestage thermoelectric generator.
Figure 6:
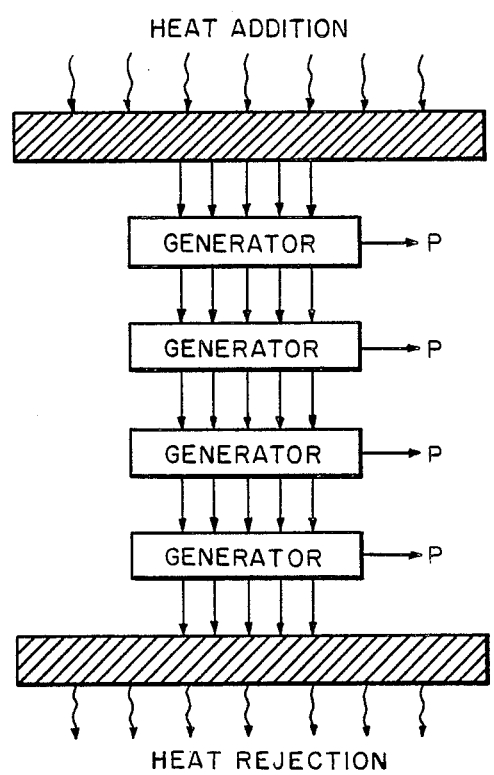
FIG. 6 is a schematic illustration of a cascaded thermoelectric generator having four stages, each producing power.

The power source unit 16 is a thermoelectric unit and is best shown in FIGS. 4, 5 and 6. FIG. 4 shows the basic power unit which has a heat absorbing reservoir 100 situated in the solar power unit and a heat rejecting reservoir 102 in heat transferring contact with the condenser 78 to be at a lower temperature than the reservoir 100. The reservoirs are connected together by semiconducting materials A and B so that current i flows because of the Seebeck effect. A storage battery 104 is connected to the material B and is charged as current flows in the direction indicated in FIG. 4, that is during exposure of the container to solar radiation. However, if the current is reversed, the device will discharge heat at the reservoir 100 and absorb heat at the reservoir 102 and the unit becomes a refrigerator as well as a source of power for the pump and the heater as well as the other elements of the container 10. The battery is used to reverse the current flow, and is operated by a switch 108 connected to the thermostat 96. The switch 108 is operated by the thermostat upon such thermostat sensing a preset temperature in the container. A full discussion of the basic thermoelectric unit is contained in textbooks such as "Energy Conversion" by Sheldon S. L. Chang, published by Prentice-Hall in 1963, and the disclosure of chapter three (pages 65–106) is incorporated herein by reference. In this incorporated material, various materials are discussed as being suitable for use on such a thermolelectric power unit, and reference is made thereto for such discussion. The battery can be a re-chargeable battery such as a Nickel-Cadmium battery located in the bottom of the container to be easily acessible for replacement, if so desired.

The power unit used in the container 10 can be either a single-stage device, such as shown in FIG. 5, or a cascaded device with four stages such as shown in FIG. 6. Each of the stages of the FIG. 6 device produces power P which can be used to drive the pump, the heater the thermostat or a fan 110 mounted in the unit to ensure that there is a uniform temperature in the receptacle by inducing turbulence into that receptacle. One of the generators shown in FIG. 6 represents the battery 104.

To further ensure an even temperature distribution in the receptacle 34 and in adeal temperature of about 35° F. for example, the device 10 further includes a plurality of heat pipes, such as heat pipe 112 mounted in the wall of the container to have a heat absorbing end 114 located adjacent to the forward wall 26 and a heat rejecting end 116 located adjacent to the condenser 78 to reject heat to that condenser. The heat pipes also include hollow cylindrical bodies 118 and absorbs heat at end 114 and releases heat at the end 116 through condensation of vapor. The heat pipe will operate in a specific temperature range and will thus tend to keep the temperature in the receptacle uniform.

Figure 7:
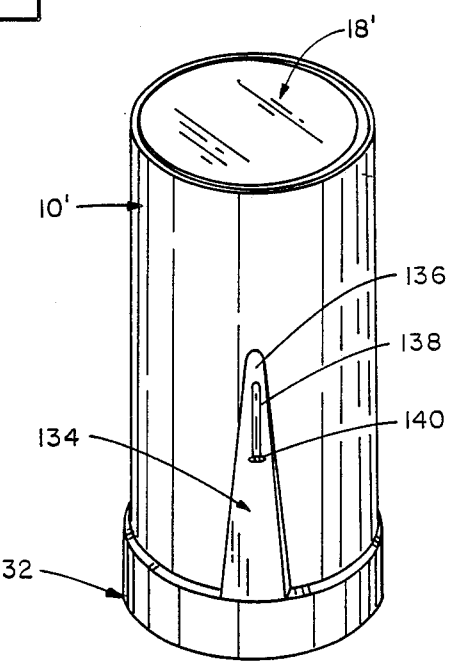
FIG. 7 is a perspective of a second form of the food storage container embodying present invention.

An alternative form of the container is shown in FIG. 7 as a drink container 10'. The container 10' includes a solar collector unit 18' and has a cylindrical wall 130 slidably and pivotally connected to a top 132 by a connection 134. The connection 134 includes a leg 136 having a slot 138 defined therein and through which a pin 140 fits.

It is understood that while certain forms of the present invention have been illustrated and described herein, it is not to be limited to the specific forms or arrangements of parts described and shown.

We claim:

1. A food storage container comprising:
   (A) a case unit which includes
      (1) an open-topped food-container portion having a bottom outside wall, a front outside wall, a rear outside wall, end outside walls, and an interior wall, said outside walls being connected together to form a receptacle having an open top and said interior wall being connected to said bottom and to said front and rear outside walls to form a compartment in said food-container portion,
      (2) a top portion having side walls, end walls and a handle attached thereto, and
      (3) pivot means connecting said top portion to said food-container portion so that said top portion moves between a covering position covering said open topped food-container portion and an uncovering position exposing the interior of said food-container portion to access via said open top;
   (b) a cooling unit in said case unit and including
      (1) a solar energy collector on said rear outside wall,
      (2) an evaporator located in said food-container portion adjacent to said rear outside wall,
      (3) a condenser located in said compartment,
      (4) conduit means fluidically connecting said solar energy collector, said evaporator and said condenser to form a fluid circuit,
      (5) a refrigerant fluid in said fluid circuit, and (6) a pump fluidically connected to said conduit means to force said refrigerant fluid through said fluid circuit;

(c) a power source unit in said case unit and including a thermoelectric generator which has
(1) a heat absorbing reservoir in heat transferring relation with said solar energy collector,
(2) a heat rejecting reservoir mounted on said case unit in heat transferring relation to said evaporator,
(3) a thermoelectric conducting means connecting said reservoirs together, and
(4) a storage battery electrically connected to said thermoelectric conducting element and to said cooling unit pump; and (D) a heat distribution unit mounted in said case and including a plurality of heat pipes having a heat absorbing end located adjacent to and in heat transferring relation with said front outside wall, and a heat rejecting end located adjacent to and in heat transferring relation with said evaporator.

2. The container defined in claim 1 wherein said power source unit includes a plurality of series-connected stages.

3. The container defined in claim 2 wherein said heat distribution unit further includes a fan connected to said battery.

4. The container defined in claim 3 further including a thermostat mounted in said receptacle.

* * * * *